United States Patent
Imai et al.

(10) Patent No.: US 6,447,603 B2
(45) Date of Patent: Sep. 10, 2002

(54) PROCESS AND APPARATUS FOR PRODUCING OXIDE SINGLE CRYSTALS

(75) Inventors: Katsuhiro Imai, Nagoya; Akihiko Honda, Aichi Pref.; Minoru Imaeda, Nagoya, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/793,193

(22) Filed: Feb. 26, 2001

(30) Foreign Application Priority Data

Mar. 3, 2000 (JP) ........................................ 2000-058345

(51) Int. Cl.$^7$ .............................................. C30B 13/02
(52) U.S. Cl. ........................... 117/83; 117/81; 117/200; 117/204; 117/900
(58) Field of Search .............................. 117/81, 83, 200, 117/204, 900

(56) References Cited

U.S. PATENT DOCUMENTS 5,690,734 A   11/1997   Imaeda et al.

FOREIGN PATENT DOCUMENTS

EP   0 733 728 A2   9/1996
JP   8-319191   12/1996

OTHER PUBLICATIONS

Yoon, D.H., et al., "Morphological Aspects of Potassium Lithium Niobate Crystals with Acicular Habit Grown by the Micro–Pulling–Down Method," Journal of Crystal Growth, vol. 144 (1994), pp. 207–212.

Primary Examiner—Felisa Hiteshew
(74) Attorney, Agent, or Firm—Burr & Brown

(57) ABSTRACT

A process is disclosed for producing an oxide single crystal, including the steps of: melting a raw material for a single crystal of an oxide inside a crucible, contacting a seed crystal with the resulting melt, growing the oxide single crystal by pulling-down the melt through an opening of the crucible in a given pulling-down axis, and fixedly holding the seed crystal and then reducing an angle of a given crystalline orientation of the seed crystal selected for growing the single crystal to the pulling-down axis.

6 Claims, 3 Drawing Sheets

PROCESS AND APPARATUS FOR PRODUCING OXIDE SINGLE CRYSTALS

BACKGROUND OF THE INVENTION (1) Field of the Invention

The present invention relates to a process and an apparatus for producing single crystals of oxides.

(2) Related Art Statement

A single crystal of lithium potassium niobate and a single crystal of lithium potassium niobate-lithium potassium tantalate solid solution are remarked especially as single crystals for a blue light second harmonic generation (SHG) device for a semiconductor laser. The device can emit even the ultraviolet lights having the wavelengths of 390 nm or so, thus the crystals can be suitable for wide applications such as optical disk memory, medicine and photochemical fields, and various optical measurements by using such short-wavelength lights. Since the above single crystals have a large electro-optic effect, they can be also applied to optical memory devices using the photo-refractive effect.

However, for an application of a second harmonic generation device, for example, even a small fluctuation in a composition of the single crystal may affect the wavelength of the second harmonic wave generated by the device. Therefore, the specification of the range of the composition required for the single crystals is severe, and the fluctuation in the composition should be suppressed in a narrow range. However, since the composition consists of as many as three or four components, growing a single crystal at a high rate is extremely difficult to achieve while controlling the proportions of the components to be constant.

In addition, laser beams, having a short wavelength of around 400 nm, for example, need to be propagated inside of the single crystal at as high an output density as possible in the case of the optical applications, particularly the second harmonic generation. Further, optical damage needs to be suppressed. The good crystallinity of the single crystal is required for this purpose.

NGK Insulators, Ltd. suggested a micro ($\mu$) pulling-down method for growing the above single crystal with the constant compositional proportions, for example, in JP-A-8-319,191. In this method, a raw material comprising lithium potassium niobate is put into a platinum crucible and melted, and then the melt is pulled down gradually and continuously through a nozzle attached to the bottom of the crucible.

Such a micro pulling-down method is useful for growing the above oxide single crystal having many components. However, for widespread uses of the above single crystal, increased industrial productivity is indispensable. For this purpose, the capacity of the crucible needs to be increased to grow as many single crystals as possible. To attain this, it is necessary that a driving unit is provided under the crucible, a seed crystal is bonded to an upper end of the driving unit, the seed crystal is contacted with the melt in the crucible, and the seed crystal is pulled down as straight as possible at a high precision. As such a high precision pulling-down mechanism, a driving unit using a rail may be used, for example.

However, inventors' mass production experiments revealed that a single crystal having good crystallinity was successfully grown by pulling down the seed crystal at a high precision in the beginning, but as the grown length of the oxide single crystal increases (with lapse of time), the crystallinity of the oxide single crystal is deteriorate to reduce the yield.

SUMMARY OF THE INVENTION

It is an object of the present invention to prevent deterioration in the crystallinity of a single crystal which would accompany increase in the grown length of the single crystal, when a raw material for the oxide single crystal is melted in a crucible, a seed crystal is contacted with the melt, and the oxide single crystal is grown, while being pulled down through an opening of the crucible in a given pulling-down axis.

A first aspect of the present invention relates to a process for producing an oxide single crystal, comprising the steps of:

melting a raw material for a single crystal of an oxide inside a crucible, contacting a seed crystal with the resulting melt, growing the oxide single crystal by pulling-down the melt through an opening of the crucible in a given pulling-down axis, fixedly holding the seed crystal and then reducing an angle of a given crystalline orientation of the seed crystal selected for growing the single crystal to the pulling-down axis.

A second aspect of the present invention relates to an apparatus for producing a single crystal of an oxide, comprising a crucible for melting a raw material of the oxide single crystal, and a stand for holding a seed crystal, said stand comprising a holding member for fixedly holding the seed crystal, and an inclining mechanism attached to the under side of the holding member, and adapted to incline an angle of the holding member to a given pulling-down axis, wherein a raw material of the oxide single crystal is melted in the crucible, the seed crystal is contacted with the resulting melt, the oxide single crystal is grown by pulling-down the melt through an opening of the crucible, and an angle of the holding member to the pulling-down direction is reduced.

With respect to the above-mentioned cases where the crystallinity of the single crystals were gradually deteriorated as the grown length thereof increased, the inventors observed the state of the single crystal fibers and the plates in detail. As a result, it was found that the diameter slightly decreased in a direction from one end to the other of the single crystal fiber. In other words, there was tendency that the diameter of the single crystal fiber slightly decreased in a direction from a growth-starting end to a growth-terminating end. Further, it was found that the single crystal plate slightly twisted.

Based on such knowledge, the inventors further made investigations, and then considered that a way of holding the seed crystal might be a cause. That is, the seed crystal needs to be pulled down after being bonded to the holding member. In order to bond the seed crystal to the holding member, a specific crystalline orientation of the seed crystal is selected as a crystal-growing direction, and then this crystalline orientation is aligned with the direction of the pulling-down axis. The thus selected crystalline orientation is ordinarily in parallel to the direction of a specific side constituting the outer configuration of the seed crystal. Therefore, if the seed crystal is bonded to the holding member just straightly with this specific side being taken as a reference, the direction of the specific side of the seed crystal (that is, the above crystalline orientation of the seed crystal) must be aligned with the pulling-down axis.

However, even if the seed crystal is bonded to the holding member in the state that the above crystalline orientation of the seed crystal is aligned with the pulling-down axis, it is considered that the crystalline orientation of the seed crystal may actually deviated from the pulling-down axis owing to unspecified causes such as non-uniform shrinkage of the adhesive during curing. In such a case, even if the seed crystal is pulled down in the direction of the pulling-down direction, the crystalline orientation of the seed crystal is oblique to the pulling-down axis. The oxide single crystal grows in the direction of the crystalline orientation of the seed crystal. Accordingly, the single crystal-growing direction is slightly inclined to the pulling-down axis. As a result, it is considered that although no serious problem exists at a time when the single crystal begins to grow, the diameter of the single crystal fiber gradually decreases or the width of the single crystal plate gradually decreases as the single crystal grows long.

Based on this hypothesis, the inventors tried to provide an inclining mechanism for inclining the holding member by varying its angle to the pulling-down axis, incline the holding member relative to the pulling-down axis after the seed crystal is held by the holding member, and thereby reduce the angle of the pulling-down axis to the crystalline orientation selected for the growth of the crystal. As a result, the inventors succeeded in preventing the shrinkage of the diameter of the single crystal fiber and the shrinkage of the width of the single crystal plate. In addition, the inventors discovered that the crystallinity of the single crystal is not deteriorated as compared with that at the time of starting the crystal growth.

In the present invention, the angle of the crystalline orientation of the seed crystal selected for the crystal growth to the pulling-down axis is particularly preferably controlled to not more than 0.5°, more preferably not more than 0.2°.

The seed crystal preferably a cross-sectional shape identical with or similar to but smaller than or anyway reduced in size in any direction from that of the bottom face of the nozzle portion. In other words, if the bottom of the nozzle portion is of a polygonal cross-sectional shape, for example, a rectangular cross-sectional shape, the seed crystal has a polygonal, e.g., rectangular cross-sectional shape identical with or similar to but smaller than or reduced in size from that of the nozzle bottom face. As to the last case, if the bottom face of the nozzle portion is 50 mm wide×2 mm width, the cross-sectional shape of the seed crystal may be 30 mm×1, for example.

In a preferred embodiment of the present invention, the stand is provided with a turning mechanism for turning the holding member around the pulling-down axis. After the seed crystal is held by the holding member, the holding member is turned to match the cross-sectional shape of the seed crystal with the bottom face of the nozzle portion. "To match the cross-sectional shape of the seed crystal with the bottom face of the nozzle portion" means that the sides of the cross-sectional shape of the seed crystal are arranged to be matched with or faced with corresponding ones of the bottom face of the nozzle portion. By turning the seed crystal around the pulling-down axis, angles defined by plural pairs of sides of the polygonal cross-sectional shape of the seed crystal and corresponding ones of the polygonal shape of the opening of the crucible, respectively, are reduced. This angle is preferably not more than 0.5°, more preferably not more than 0.3°.

This embodiment will be explained. For example, when a single crystal plate is grown, the grown single crystal plate is slightly twisted besides the above-mentioned problems. As mentioned above, the present inventors tried to provide the turning mechanism for turning the seed crystal around the pulling-down axis and approach the configuration of the cross section of the seed crystal to that of the bottom face of the nozzle by turning the holding member. As a result, it was discovered that the twisting deformation of the single crystal plate grown was reduced or almost not observed and that the crystallinity was improved over the entire length of the single crystal plate.

The configuration of the bottom face of the nozzle portion and the cross-sectional configuration of the seed crystal are particularly square or rectangular. In that case, the ratio between the adjacent sides particularly preferably ranges 1:1 to 100.

BRIEF DESCRIPTION OF THE DRAWINGS

In the following, an embodiment of the producing apparatus according to the present invention will be illustrated by way of example.

DETAILED DESCRIPTION OF THE INVENTION

Figure 1:
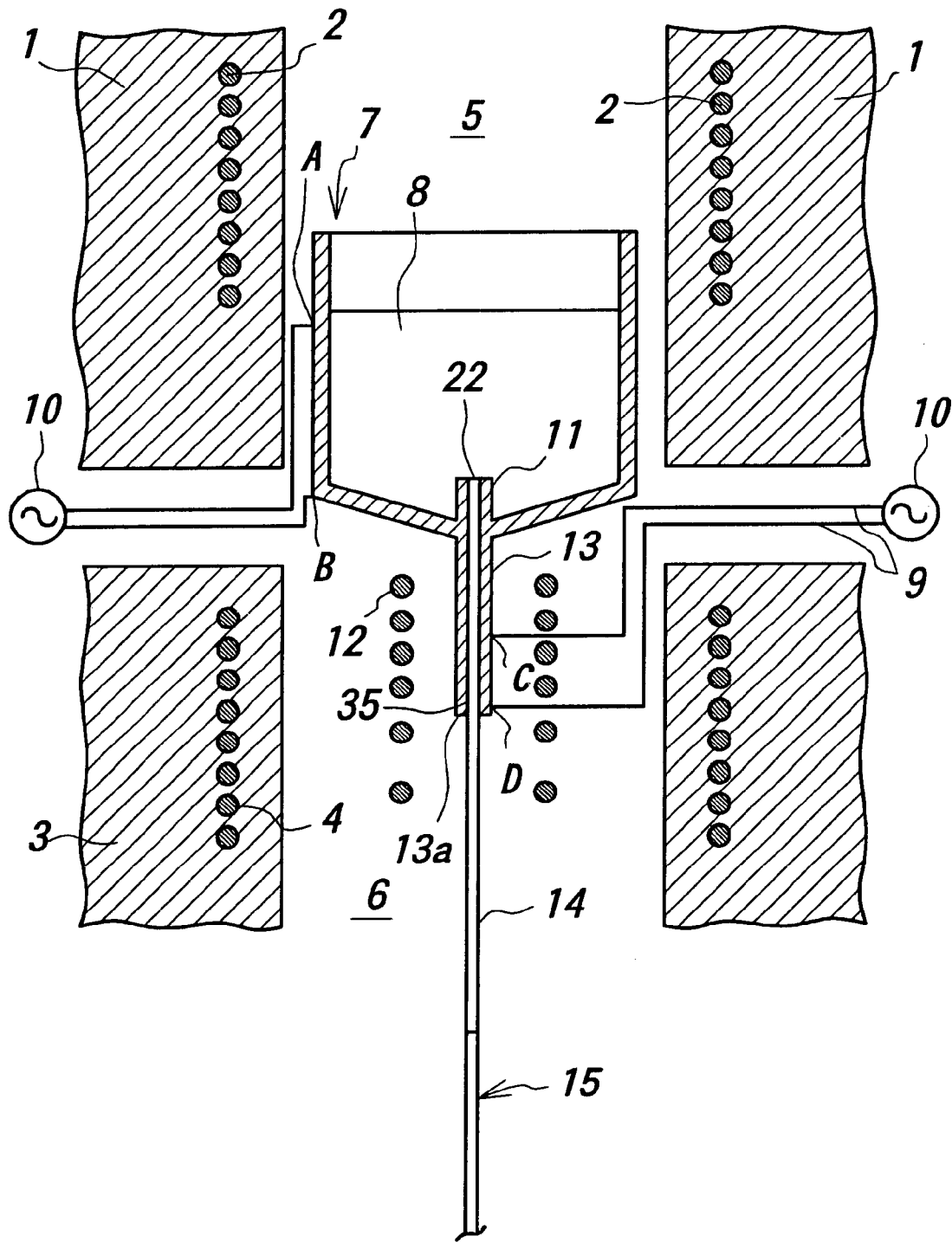
FIG. 1 is a schematically sectional view showing the producing apparatus for the growth of single crystals.

A crucible 7 is placed in a furnace housing. An upper furnace unit 1 is arranged to surround the crucible 7 and an upper space 5 thereof, and has a heater 2 buried therein. A nozzle portion 13 extends downwardly from a bottom part of the crucible 7, and an opening 13a is formed a lower end of the nozzle 13. A lower furnace unit 3 is arranged to surround the nozzle portion and a lower space 6 thereof, and has a heater 4 buried therein. The crucible 7 and the nozzle portion 13 are both made of a corrosion-resistant conductive material.

One of electric poles of an electric power source 10 is connected to a location A of the crucible 7 via a wire 9, and the other similarly connected to a lower bent B of the crucible 7. One of electric poles of another electric power source 10 is connected to a location C of the nozzle portion 13 via a wire 9, and the other similarly connected to a lower end D of the nozzle portion 13. These current-passing systems are separated from each other so that their voltages can be independently controlled.

An after-heater 12 is further located in the space 6 to surround the nozzle 13 with a distance. An intake tube 11 extends upward in the crucible 7 and an intake opening 22 is provided at the upper end of the intake tube 11. The intake opening 22 protrudes from a bottom portion of a melt.

The upper furnace unit 1, the lower furnace unit 3 and the after-heater 12 are allowed to heat for setting an appropriate temperature distribution for each of the space 5 and space 6. Then a raw material of the melt is supplied into the crucible 7 and the electricity is supplied to the crucible 7 and the nozzle 13 for heating. In this state, a slight amount of the melt 8 projects through the opening 13a at a single crystal-growing portion 35 at the lower end portion of the nozzle portion 13.

In this state, a seed crystal is moved upwardly, so that an upper face 15c of the seed crystal 15 is contacted with the melt 8. Then, the seed crystal 15 is downwardly pulled. At that time, a uniform solid phase/liquid phase interface (meniscus) is formed between the upper end of the seed crystal 15 and the melt 8 being pulled out downwardly from the nozzle 13. As a result, a single crystal 14 is continuously formed at the upper side of the seed crystal 15, and drawn out downwardly.

Figure 2:
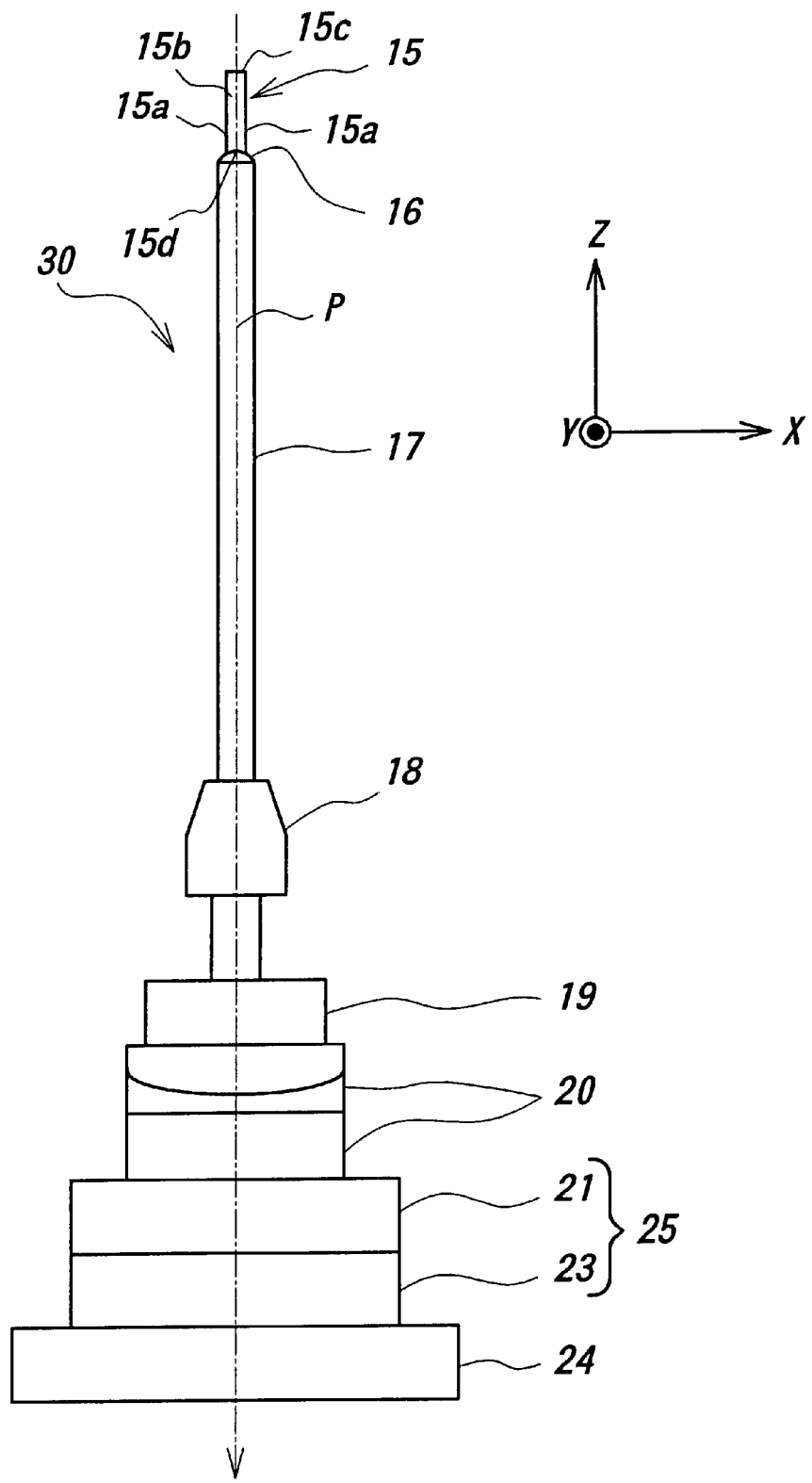
FIG. 2 is a front view showing a stand 30 for holding a seed crystal.
Figure 3A:
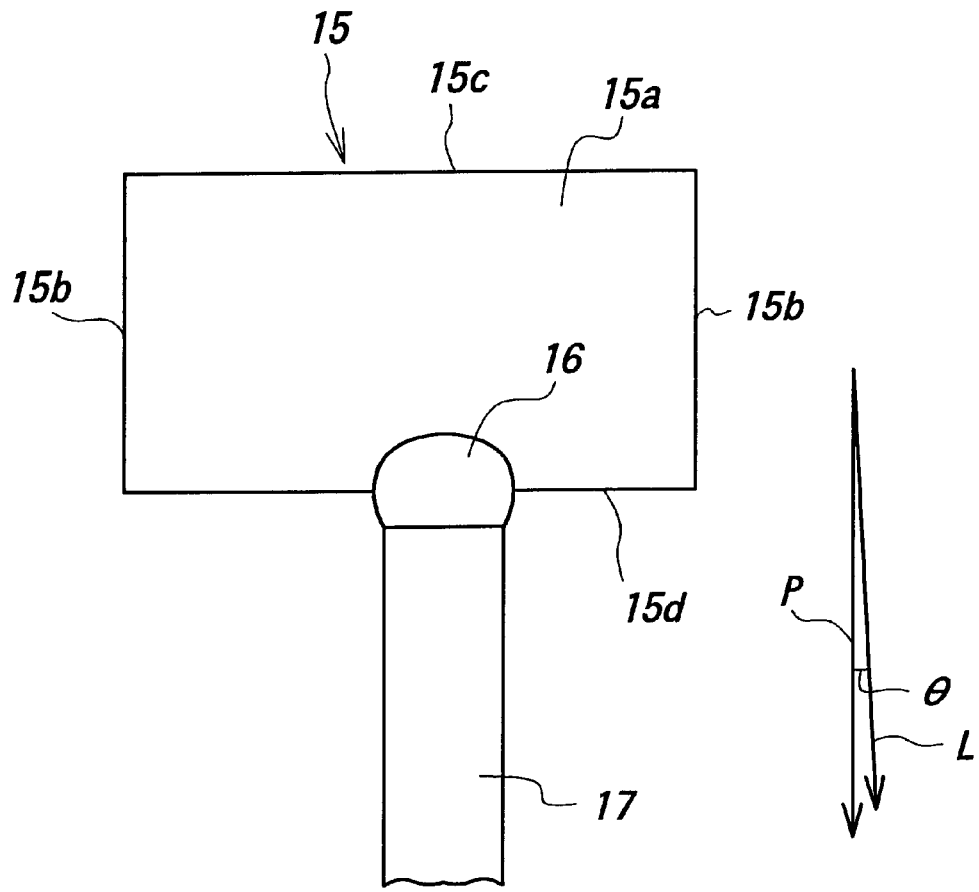
Figure 3B:
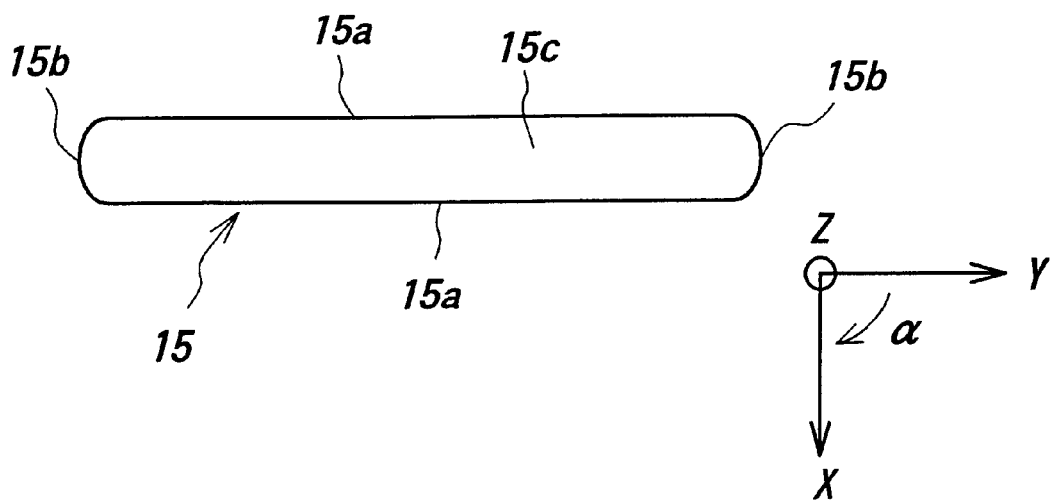

As the seed crystal, those having various shapes may be used. In this embodiment, for example, a planar seed crystal, that is, a single crystal plate is used as the seed crystal. As shown in FIGS. 2, 3(a) and 3(b), the seed crystal has a pair of wide main planes 15a, a pair of side planes 15b, an upper face 15c to contact the melt, and a bottom face 15d opposite to the upper face 15c.

A stand 30 is arranged on a fitting table 24. The fitting table 24 is attached to an external driving mechanism not shown. The driving mechanism pulls down the entire stand 30 in a direction of a pulling-down axis P.

The bottom 15d of the seed crystal 15 is bonded to an upper end of a holding member 17 with an adhesive 16. The lower end of the holding member 17 is chucked, via a chuck 18, to an adjusting mechanism under the chuck. The entire adjusting mechanism is attached onto the fitting table 24. The adjusting mechanism comprises a turning mechanism 19, an inclining mechanism 20 and a horizontally moving mechanism 25.

The rotary mechanism 19 can turn the holding member around the pulling-down axis P. The inclining mechanism 20 can incline the holding member 17, relative to the pulling-down axis, in an arbitrary direction. The horizontally moving mechanism 25 includes an X-axis moving mechanism 23 and a Y-axis moving mechanism 21. The X-axis moving mechanism 23 can arbitrarily move the holding member in the X-axis direction as shown in FIG. 3(b). The Y-axis moving mechanism 21 can arbitrarily move the holding member in the Y-axis direction. The Z-axis in FIG. 3(b) corresponds with the pulling-down axis P.

In a preferred embodiment of the present invention, a single seed crystal 15 is bonded to the holding member, and then a plurality, for example, ten of single crystals are successively grown. Therefore, for example, after growth of the first single crystal fiber or plate is terminated, changes in dimensions such as the diameter and the width of the cross section of the single crystal are examined in detail. If any deviation is observed, the mechanisms 19 and 20 are operated depending upon such deviations. Thereafter, a next growing is performed.

For example, if the diameter of the single crystal fiber decreases in a direction from one end to the other, it is considered that the angle θ between the crystallization orientation L (See FIG. 3(a)) selected as the growing direction and the pulling-down axis P is large. Therefore, the angle of the growing face of this single crystal fiber is measured to determine the direction of the crystallization orientation L from this angle of the crystallizing face. Then, the crystallizing orientation L and the pulling-down axis P are compared with each other to calculate this angle θ. The inclining mechanism 20 is inclined to meet this angle θ, and next growing is effected. Similar adjustment is effected in a case where the width of the single crystal plate decreases in a direction of one end to the other.

If the single crystal plate is twisted, the holding member is turned around the pulling-down axis P (Z-axis) as indicated by α within a X-Y plane (a plane vertical to the pulling-down axis) as shown in FIG. 3(b), and then next growing is effected.

Although the oxide single crystal is not limited to any particular one, but recitation may be made of lithium potassium niobate (KLN), lithium potassium niobate-lithium potassium tantalate solid-solution (KLTN [$K_3Li_{2-x}(Ta_yNb_{1-y})_{5+x}O_{15+2x}$]), lithium niobate, lithium tantalate, lithium niobate-lithium tantalate solid-solution, $Ba_{1-x}Sr_xNb_2O_6$, Mn-Zn ferrite, yttrium aluminum garnet substituted by Nd, Er and/or Yb, YAG and $YVO_4$ substituted by Nd, Er and/or Y, for example.

EXAMPLES AND COMPARATIVE EXAMPLES

Comparative Example 1

A single crystal plate of lithium potassium niobate was produced according to the present invention by using a single crystal-producing apparatus as shown in FIG. 1. More specifically, the temperature of the entire furnace was controlled with an upper furnace unit 1 and a lower furnace unit 3. The temperature gradient near the single crystal-growing portion 35 was controlled by supplying the electric power to a nozzle portion 13 and generating heat from an after-heater 12. A single crystal pulling-down mechanism was mounted to pull down the single crystalline plate in a vertical direction, while controlling the pulling-down velocity evenly within a range from 2 to 100 mm/h.

A raw material for starting growth was prepared by mixing potassium carbonate, lithium carbonate and niobate oxide at a mole ratio of 30: 25:45. About 10 g of this growth-starting raw material was filled in a platinum crucible 7, and placed at a given location. The temperature of the space 5 inside the upper furnace unit 1 was adjusted in a range of 1100 to 1200°, and the material was melted inside the crucible. The temperature of the space 6 in the lower furnace unit 3 was uniformly controlled in a range of 500 to 1000°. Given electric powers were supplied to the crucible 7, the nozzle portion 13 and the after-heater 12, thereby growing the single crystal. At that time, the temperature of the single crystal-growing portion could be set at 980 to 1150°, and the temperature gradient in the single crystal-growing portion at 10 to 150°/mm. During growing the single crystal, another raw material powder was fed continuously to the crucible from an external raw material feeder not shown. As this raw material powder, a powder prepared by mixing potassium carbonate, lithium carbonate and niobium oxide at a mole ratio of 30:19:51 was used.

As the nozzle portion 13, a planar nozzle portion made of platinum was used. The dimensions of the cross-section of the inner space of the nozzle portion were 1 mm×50 mm with the length of 10 mm. The configuration of the crucible was rectangular parallelepiped. The width and the length of the inner space of the crucible was 10 mm and 50 mm, respectively, with the depth of 10 mm. In this state, a single crystal plate was pulled down in a direction <110> (crystallizing orientation selected for growth) at a rate of 20 mm/h. The cross section of the single crystal plate has a rectangular shape of 1 mm×30 mm.

As a seed crystal, a planar single crystal of lithium potassium niobate was used. The seed crystal had a rectangular cross-sectional shape of 1 mm×30 mm. The half-width value of an X-ray locking curve of the se 50 seconds (Measuring apparatus: MRD diffractometer manufactured by Philips, measured reflection: 004).

Then, a bottom face 15d of a seed crystal 15 was bonded to a holding member 17 with a heat-resistant inorganic adhesive as shown in FIG. 2. Only a horizontally moving mechanism 25 and a fitting table 24 were arranged under a chuck 18.

As a result, a single crystal plate having a length of 100 mm was grown. This single crystal plate had a width of 30 mm and a thickness of 1.0 mm at a growth-starting point and a width of 20 mm and a thickness of 0.7 mm at a growth-terminating point. The plate was visually slightly twisted. A sample was cut from a site of this single crystal plate at 50 mm from the growth starting point, and the sample was observed by the X-ray diffraction method to give a half-width value of an X-ray locking curve of not less than 100 seconds.

Example 1

After Comparative Example 1 was performed, the single crystal plate was removed from the seed crystal. At this point of time, the seed crystal 15 still remained bonded to the holding member 17. Subsequently, a holding member was fitted to a stand 30 as shown in FIG. 2 without removing the seed crystal 15 from the holding member 17. Then, the inclining mechanism 20 was inclined to adjust an angle between a direction <110> in Comparative Example 1 and a pulling-down axis to not more than 0.5°. Further, a turning mechanism 19 was turned by 1° in such a direction as to remove the twisting of the single crystal plate. After that, a single crystal plate of lithium potassium niobate was grown again by using the apparatus in FIG. 1 in the same manner in Comparative Example 1.

As a result, the single crystal plate having a rectangular shape of 1 mm×30 mm was grown with a length of 100 mm. This single crystal plate had a width of 30 mm and a thickness of 1.0 mm at a growth-starting point and a width of 30 mm and a thickness of 1.0 mm at a growth-terminating point. The plate was not visually twisted. A sample was cut from a site of this single crystal plate at 50 mm from the growth starting point, and the sample was observed by the X-ray diffraction method to give a half-width value of an X-ray locking curve of 40 seconds.

With respect to a single crystal plate of lithium potassium niobate-lithium potassium tantalate solid solution, the same results as mentioned above were obtained.

Comparative Example 2

Next, a single crystal plate of lithium potassium niobate was grown, while a fibrous single crystal of lithium potassium niobate was used as a seed crystal. The seed crystal had a cross-sectional square shape of 1 mm×1 mm. The longitudinal direction of the fiber was directed to a <110> direction, which was coincident with the crystallizing orientation for the crystal growth. The half-width value of an X-ray locking curve of the seed crystal was 80 seconds.

A single crystal-producing apparatus was prepared in the same manner as in Comparative Example 1, and a single crystal plate began to be grown. The pulling down speed for the seed crystal was 20 mm/h. The width and the thickness of the growing single crystal at a growth-starting point were the same as those of the seed crystal, that is 1 mm×1 mm. As the seed crystal was pulled down, the growth of the single crystal proceeded, so that the single crystal gradually increased in width to form a shoulder portion. When the crystal reached a width of about 15 mm, a positional deviation between the end of the crystal and the bottom of the nozzle portion became larger to cause twisting. As a result, it was difficult to further increase the width. When the crystal was grown continuously up to a length of 100 mm in this state, the crystal had a width of 10 mm and a thickness of 0.7 mm at the growth-terminating point. Twisting was observed in the entire single crystal plate. A sample was cut out from a site of this single crystal plate at 50 mm from the growth starting point, and the sample was observed by the X-ray diffraction method to give a half-width value of an X-ray locking curve of not less than 100 seconds.

Example 2

After Comparative Example 2 was performed, the single crystal plate was removed from the seed crystal. At this point of time, the seed crystal 15 still remained bonded to the holding member 17. Subsequently, a holding member was fitted to a stand 30 as shown in FIG. 2 without removing the seed crystal 15 from the holding member 17. Then, the inclining mechanism 20 was inclined to adjust an angle between a direction <110> in Comparative Example 2 and a pulling-down axis to not more than 0.5. Further, a turning mechanism 19 was turned by 1° in such a direction as to remove the twisting of the single crystal plate. After that, a single crystal plate of lithium potassium niobate was grown again by using the apparatus in FIG. 1 in the same manner in Comparative Example 2.

In Example 2, the width of the crystal increased at the shoulder portion without being twisted, and reached 30 mm. In this state, the crystal was grown continuously to a length of 100 mm, and had a width of 30 mm and a thickness of 1.0 mm at that time. The plate was not visually twisted. A sample was cut from a site of this single crystal plate at 50 mm from the growth starting point, and the sample was observed by the X-ray diffraction method to give a half-width value of an X-ray locking curve of 40 seconds.

As mentioned above, according to the present invention, when the raw material of the oxide single crystal is melted in the crucible, the seed crystal is contacted with the resulting melt, and the oxide single crystal is grown while the melt is being pulled down through the opening of the crucible in a predetermined direction, the deterioration in the crystallinity of the single crystal which would follow increase in the grown length of the single crystal can be prevented.

What is claimed is:

1. A process for producing an oxide single crystal, comprising the steps of:
    melting a raw material for a single crystal of an oxide inside a crucible, contacting a seed crystal with the resulting melt, growing the oxide single crystal by pulling-down the melt through an opening of the crucible in a given pulling-down axis, and fixedly holding the seed crystal and then reducing an angle of a given crystalline orientation of the seed crystal selected for growing the single crystal to the pulling-down axis.

2. The producing process set forth in claim 1, wherein the angle of said crystalline orientation to the pulling-down axis is controlled to not more than 0.5°.

3. The producing process set forth in claim 1, wherein the crucible comprises a nozzle, and after the seed crystal is fixedly held, the seed crystal is turned around the pulling-down axis and thereby the cross sectional shape of the seed crystal is brought into conformity with a shape of a bottom of a nozzle.

4. The producing process set forth in claim 1, wherein the seed crystal has a polygonal cross-sectional shape, the bottom of the nozzle has a shape identical with or similar to the polygonal cross-sectional shape of the seed crystal, and after the seed crystal is fixedly held, the seed crystal is turned around the pulling-down axis and thereby angles defined by plural pairs of sides of the polygonal cross-sectional shape of the seed crystal and corresponding ones of the polygonal shape of the bottom of the nozzle, respectively, are reduced.

5. The producing process set forth in claim 4, wherein each of the angles defined by plural pairs of the sides of the polygonal cross-sectional shape of the seed crystal and the corresponding ones of the polygonal shape of the bottom of the nozzle, respectively, is not more than 0.5°.

6. The producing process set forth in claim 1, wherein each of the seed crystal and the bottom of the nozzle has a rectangular shape.

* * * * *